United States Patent [19]

Kitagawa et al.

[11] Patent Number: 4,786,216
[45] Date of Patent: Nov. 22, 1988

[54] PRINTED CIRCUIT BOARD DRILLING MACHINE

[75] Inventors: Hideo Kitagawa, Tokyo; Toshihiko Mizuno, Mitaka, both of Japan

[73] Assignee: Hiraoka Kogyo Kabushiki Kaisha, Saitama, Japan

[21] Appl. No.: 43,388

[22] Filed: Apr. 28, 1987

[30] Foreign Application Priority Data

May 6, 1986 [JP] Japan ............... 61-102107

[51] Int. Cl.⁴ .................................. B23Q 1/18
[52] U.S. Cl. ........................... 408/69; 408/87; 408/91; 408/95; 408/98; 408/700
[58] Field of Search .............. 408/3, 69, 70, 87, 89, 408/91, 95, 49, 98-100, 700; 83/13, 17

[56] References Cited

U.S. PATENT DOCUMENTS 2,975,661  3/1961  Coleman ..................... 408/3
3,853,421  12/1974  Sickenger ................. 408/87 X
4,280,775  7/1981  Wood ......................... 408/3

FOREIGN PATENT DOCUMENTS 256465  9/1976  U.S.S.R. ..................... 408/700

Primary Examiner—Gil Weidenfeld
Assistant Examiner—Steven C. Bishop
Attorney, Agent, or Firm—Armstrong, Nikaido, Marmelstein & Kubovcik

[57] ABSTRACT

A printed circuit board is supported at its peripheral portion and is moved and positioned by a drive mechanism. During the drilling of a hole in the circuit board, the thrust of the drill acting upon the circuit board is born by a sliding contact surface on a stand disposed on the side of the board opposite the drill. Ultrasonic vibration is applied to the printed circuit board via the stand during the drilling operation to prevent the occurrence of expoxy smearing.

6 Claims, 5 Drawing Sheets

PRINTED CIRCUIT BOARD DRILLING MACHINE

BACKGROUND OF THE INVENTION

1. Field of the Invention

This invention relates to a drilling machine used in drilling circuit component-mounting holes, through-holes and other small apertures in a printed circuit board.

2. Description of the Prior Art

In a printed circuit board drilling machine of a type known in the art, a plurality of printed circuit boards are placed on the top side of a table movable in a horizontal plane, and a plurality of drills are supported at locations above the table so as to be movable vertically. After the table has been moved to bring the circuit boards into position, the drills are lowered to drill holes in the boards.

In order to support printed circuit boards the number whereof corresponds to the number of drills, and in order to bear the thrust of these drills during the drilling operation, the table used in the conventional machine must have a large surface area and great rigidity, and is therefore of considerable weight. This not only increases the size of the overall apparatus but also necessitates a drive motor having a high rating in order to move the heavy table at high speed and position the table accurately.

In the drilling operation, moreover, frictional heat is produced due to friction caused by contraction of the hole immediately after drilling and the resulting pressing force acting upon the periphery of the drill, friction caused when cuttings travel upward in the drill groove, and friction produced between the cuttings in the drill groove and the inner wall of the hole. The frictional heat causes the fusing of smears on the inner wall surface of the hole, which in turn is an impediments to subsequent through-hole plating. In order to solve this problem, ultrasonic mechanical vibrations can be applied to the circuit board during the drilling operation to reduce frictional resistance and promote the discharge of cuttings from the drill groove. Experiments have shown that this procedure is effective to prevent smearing.

However, since the printed circuit boards are secured on the heavy table in the conventional apparatus, the ultrasonic vibration applied from the bottom side of the table cannot be transmitted to the printed circuit boards effectively due to damping and reflection.

SUMMARY OF THE INVENTION

Accordingly, an object of the present invention is to provide a printed circuit board drilling machine which enables ultrasonic vibrations for smear prevention to be effectively applied to a printed circuit board, and which is made light in weight by dispensing with a large, heavy table.

According to the present invention, the foregoing object is attained by providing a printed circuit board drilling machine comprising a drive mechanism for supporting a printed circuit board at a peripheral portion thereof and for moving and positioning the printed circuit board in the plane thereof, a drill provided on one side of the plane with its drill shaft perpendicular to the plane and supported so as to be movable along the direction of the drill shaft, and a stand provided on a side of the plane opposite the one side at or near a position opposing the drill and having a sliding contact surface in sliding contact with the printed circuit board.

In preferred embodiments, the printed circuit board is moved in a horizontal plane, inclined plane or vertical plane, and an ultrasonic vibrator is connected to the stand.

In operation, the thrust of the drill acting upon the printed circuit board during the drilling thereof is borne substantially by the sliding surface of the stand, so that almost no thrust acts upon the drive mechanism for supporting and moving the circuit board. In addition, ultrasonic vibration is applied to the printed circuit board via the stand during the drilling operation, thereby preventing the occurrence of expoxy smearing.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

Figure 1:
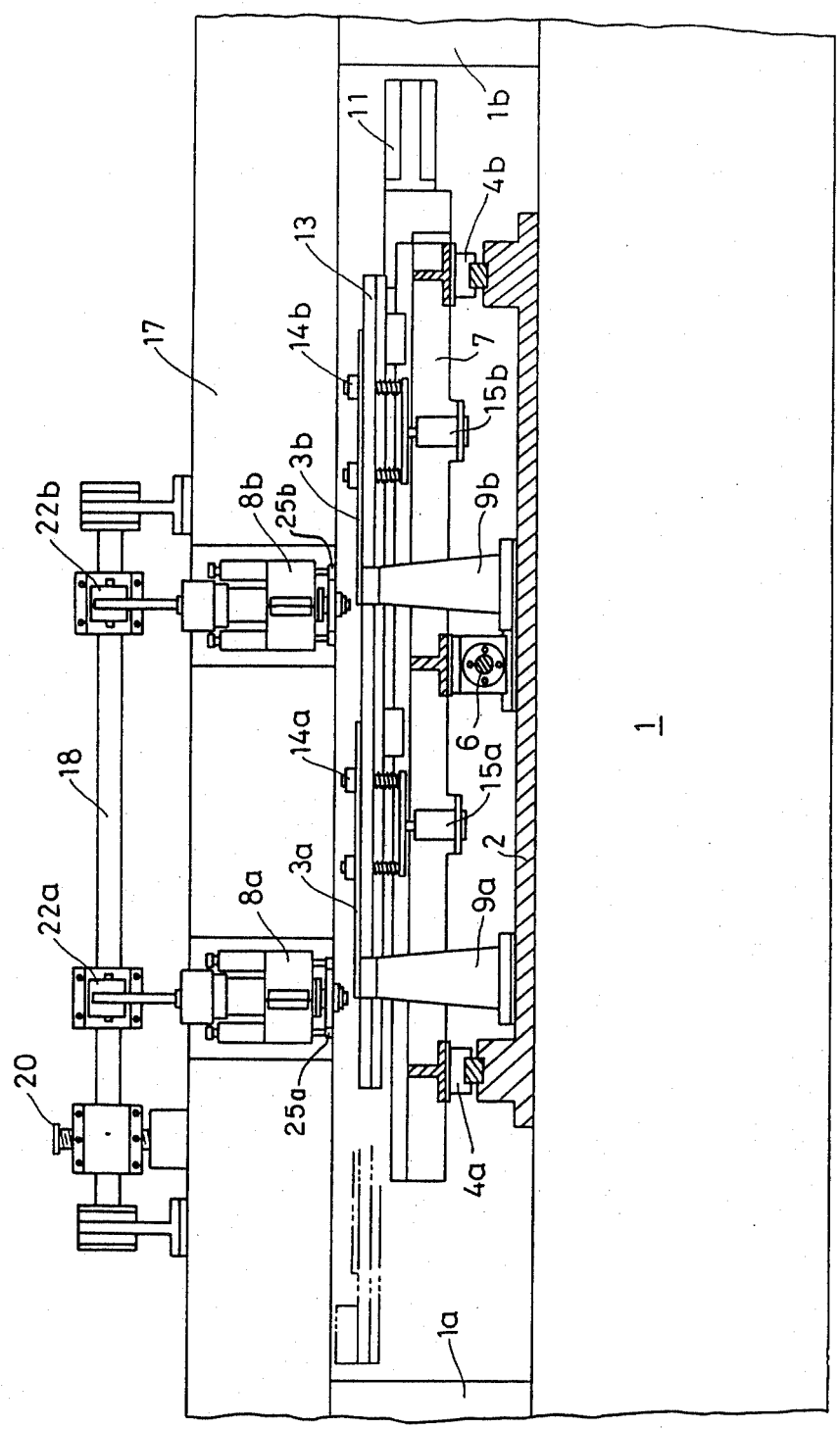
FIG. 1 is a front view illustrating an embodiment of a printed circuit board drilling machine according to the present invention.
Figure 2:
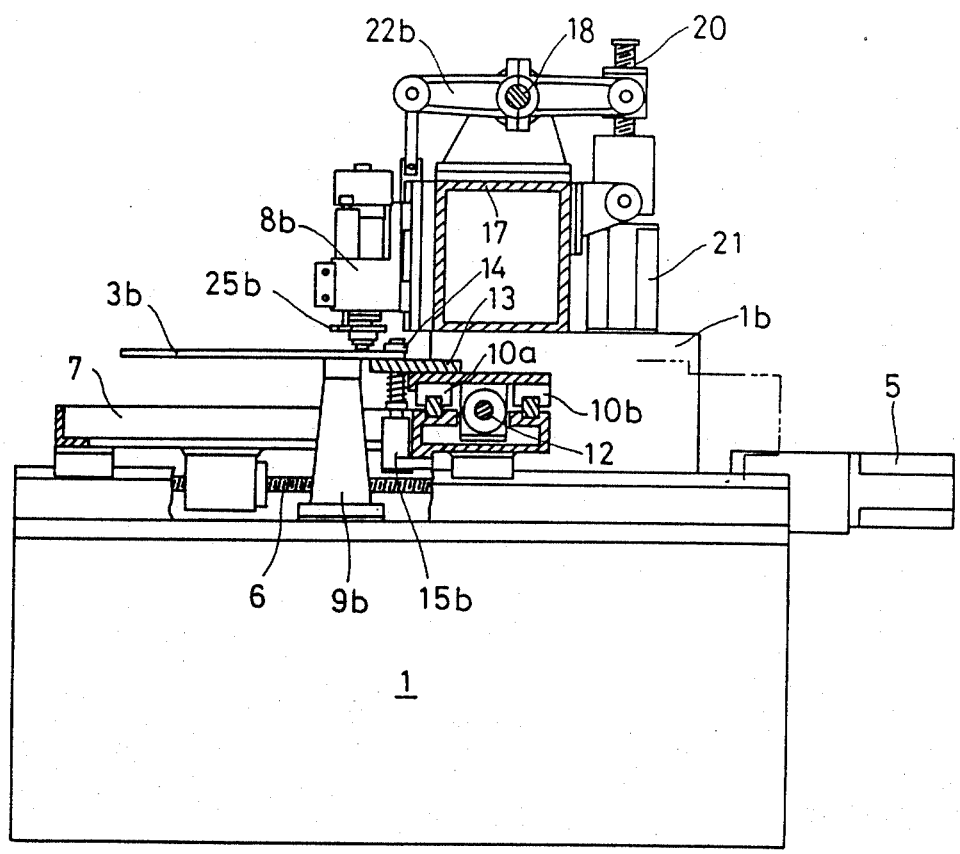
FIG. 2 is a right-side view of the drilling machine of FIG. 1.

A first embodiment of a printed circuit board drilling machine according to the invention will now be described with reference to FIGS. 1 through 4.

The drilling machine includes a bed 1 and a slide base 2 fixedly secured thereon. A frame 7 is supported on the slide base 2 via linear bearings 4a, 4b so as to be movable back and forth, i.e. perpendicular to the plane of the drawing of FIG. 1. A sliding plate 13 supporting printed circuit boards 3a, 3b is supported on the frame 7 via linear bearings 10a, 10b so as to be movable left and right in FIG. 1.

The frame 7 is driven by a servomotor 5 acting through a ball screw 6 connected to the servomotor 5, and the sliding plate 13 is driven by a servomotor 11 acting through a ball screw 12 connected to the servomotor 11, whereby the printed circuit boards 3a, 3b are capable of being moved freely in a horizontal plane.

The sliding plate 13 is provided with clamping mechanisms 15a, 15b operatively associated with respective clampers 14a, 14b. A plurality of the printed circuit boards 3a and a plurality of the printed circuit boards 3b are stacked on the sliding plate 13 and are detachably mounted thereon by the respective clampers 14a, 14b and clamping mechanisms 15a, 15b clamping the peripheral portions of the circuit boards.

Provided astride pedestals 1a, 1b at both ends of the bed 1 is a beam 17 on which drill heads 8a, 8b are supported so as to be slidable perpendicular to the printed circuit boards 3a, 3b and in the direction of the drill shafts. The drill heads 8a, 8b are driven by a servomotor 21 and ball screw 20 via a shaft 18 and respective arms 22a, 22b, whereby the heads are raised and lowered simultaneously to drill holes in the printed circuit boards 3a, 3b, respectively.

A pressure foot 25a actuated by pneumatic pressure or by a spring is provided on the lower end portion of the drill head 8a. When the drill head 8a is lowered to drill a hole in the printed circuit board 3a, the pressure foot 25a is actuated to press and support the circuit board 3a. Similarly, a pressure foot 25b provided on the lower end portion of the drill head 8b to press and support the circuit board 3b upon being actuated when the drill head 8b is lowered to drill a hole in the printed circuit board 3b.

Figure 3A:
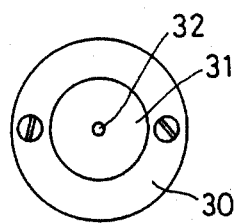
FIG. 3(A) is a plan view of a stand included in the drilling machine of FIG. 1.
Figure 3B:
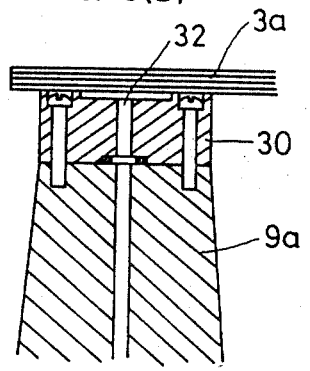
FIG. 3(B) is a front view of the stand.

Provided on the slide base 2 near positions opposing the drill heads 8a, 8b are respective stands 9a, 9b of the type shown in FIG. 3. Each stand 9a, 9b has a pad 30 provided on its upper end, the upper surface of the pad 30 serving as a sliding contact surface for coming into sliding contact with the lower surfaces of the printed circuit boards 3a, 3b. Formed in the center of the sliding contact surface is a recess 31 provided with an air jetting port 32. When the printed circuit boards 3a, 3b are moved, compressed air is jetted from the corresponding port 32 to form an air bearing mechanism.

Figure 4:
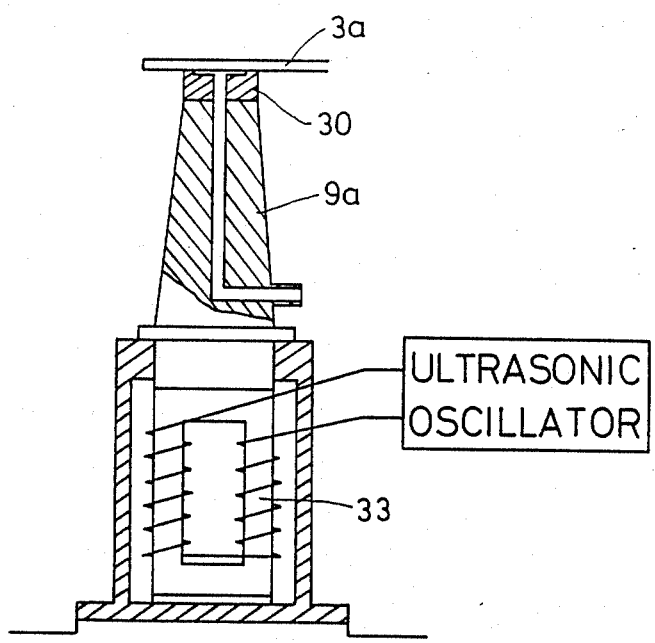
FIG. 4 is a longitudinal sectional view showing the stand and a vibrator connected to the stand in the drilling machine of FIG. 1.

As shown in FIG. 4, a vibrator 33 is connected to the stands 9a. Though not shown, a similar vibrator is connected to the stand 9b. When holes are drilled in the printed circuit boards 3a, 3b by the drills, the vibrators subject the printed circuit boards 3a, 3b to ultrasonic vibration at a frequency of 25–30 kHz and an amplitude of 4–15 microns, thereby reducing the occurrence of epoxy smear and improving the surface smoothness of the drilled hole.

In the operation of the drilling machine described above, the printed circuit boards 3a,3b are moved and positioned at the desired locations while compressed air is jetted from the corresponding air jetting ports 32 of pads 30 on the stands 9a, 9b. The drill heads 8a, 8b are then lowered to drill holes in the printed circuit boards 3a,3b while the circuit boards are vibrated ultrasonically. At such time, drill bit and pressure foot thrust acting upon the printed circuit boards 3a, 3b is substantially borne by the sliding contact surfaces of the pads 30 on the underlying stands 9a, 9b, so that almost no thrust acts upon the sliding plate 13 for supporting and transporting the printed circuit boards.

In the above-described embodiment, the stands 9a, 9b are provided near positions opposing the respective drill heads 8a, 8b. However, the stands 9a, 9b need not necessarily be so offset, for they can just as well be disposed at the positions opposing the drill heads 8a, 8b. In addition, the printed circuit boards 3a, 3b need not always be disposed horizontally, for they can be suitably tilted when necessary. It is also possible to provide the drill heads 8a, 8b on the lower side of the printed circuit boards 3a, 3b, in which case the stands 9a, 9b would be provided on the upper side.

Furthermore, it is not always necessary to use the air bearings at the same time when the printed circuit boards 3a, 3b are moved. In particular, the air bearings are entirely unnecessary if the printed circuit boards 3a, 3b are tilted in excess of a certain angle.

Figure 5:
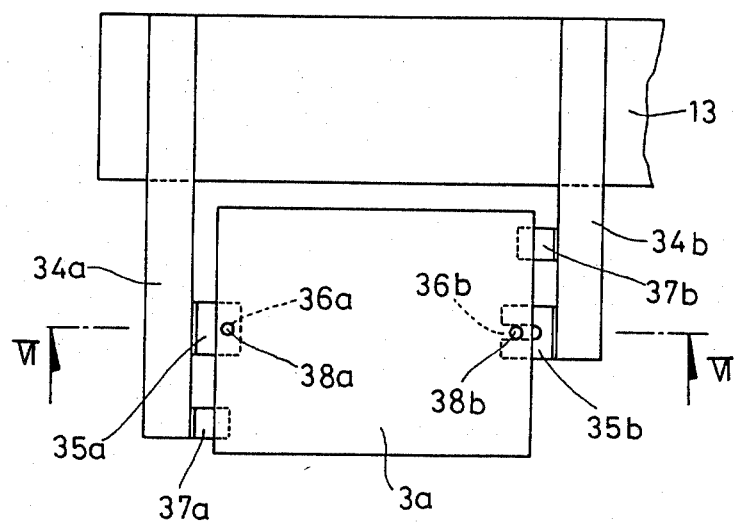
FIG. 5 is a plan view of a sliding plate support mechanism in another embodiment of the invention.
Figure 6:
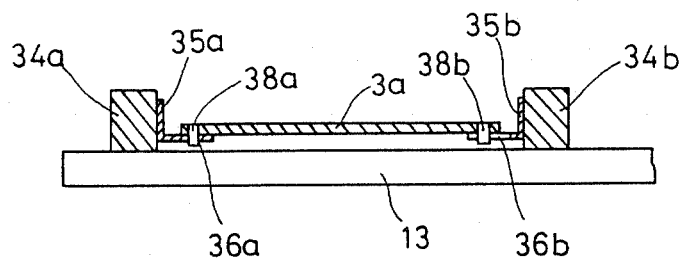
FIG. 6 is a sectional view taken along line VI—VI of FIG. 5.

FIGS. 5 and 6 are plan and sectional views, respectively, showing another embodiment of a sliding plate supporting mechanism according to the invention. Here the sliding plate 13 is provided with two arms 34a, 34b at right angles to the plate. Projecting from the opposing side faces of the arms 34a, 34b are respective supporters 35a, 35b and auxiliary supporters 37a, 37b on which the printed circuit board 3a (or 3b) is placed. The supporter 35a is formed to include a datum hole 36a into which is fitted a datum pin 38a passing through a plurality of the printed circuit boards 3a. The supporter 35b is formed to include a notch 36b for mating with a datum pin 38b provided on the side of the circuit board 3a opposite that penetrated by the datum pin 38a. With this arrangement, the printed circuit boards 3a,3b are held on the sliding plate 13 without using the clampers and clamping mechanisms. In other aspects, the construction and operation of this embodiment are exactly the same as those of the first embodiment.

Figure 7:
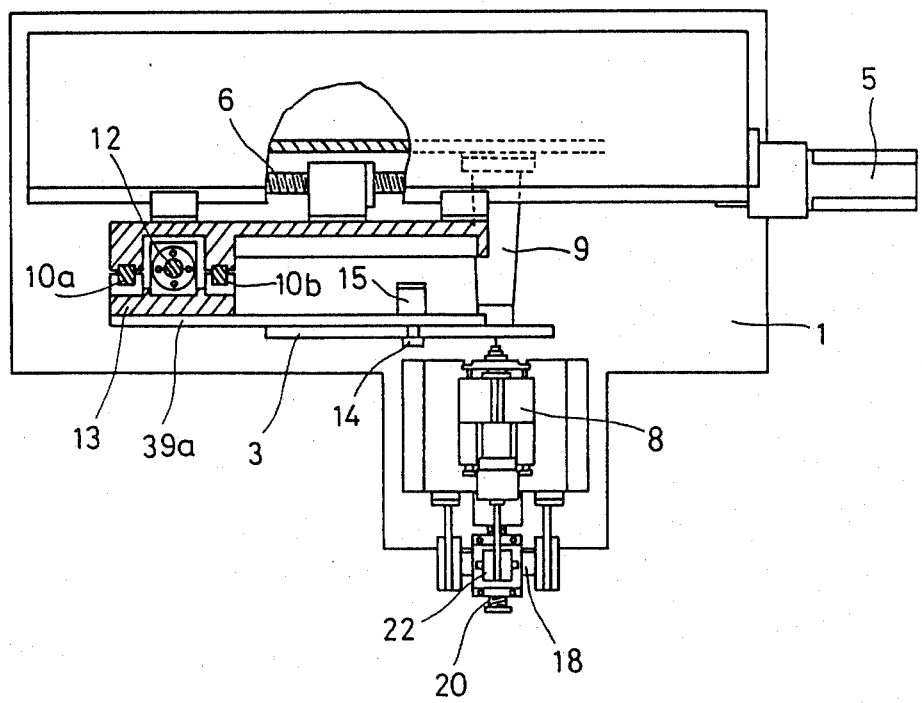
FIG. 7 is a plan view illustrating a third embodiment of the invention.
Figure 8:
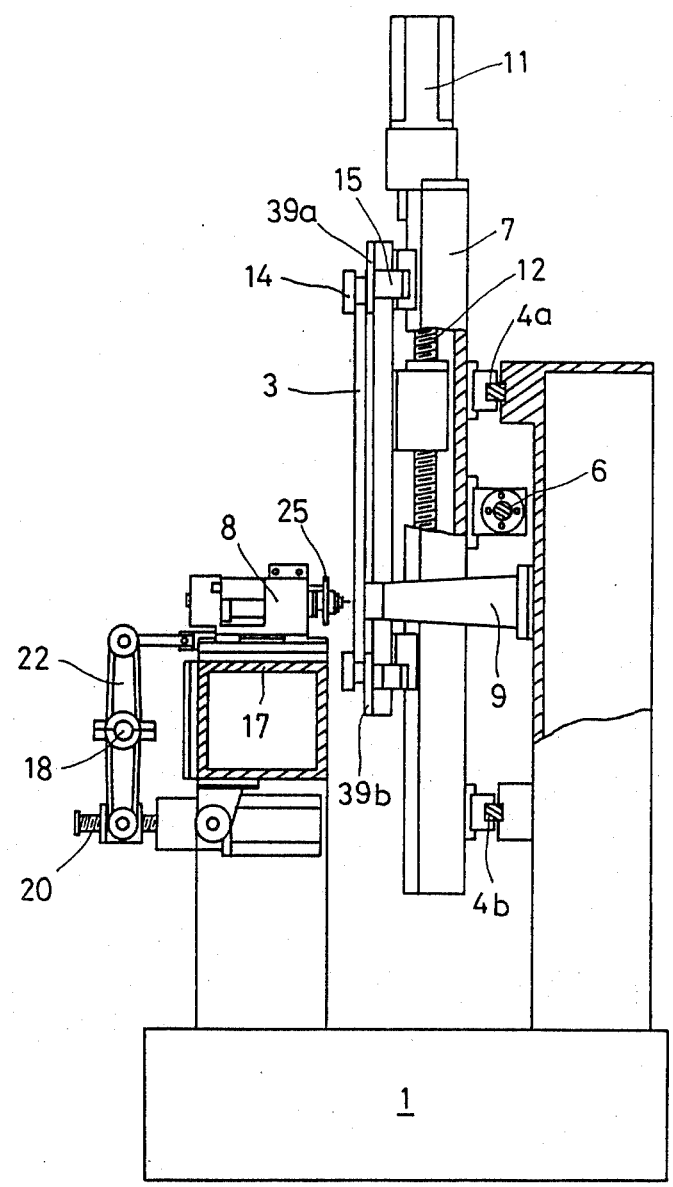
FIG. 8 is a right-side view of the third embodiment.

FIGS. 7 and 8 are a plan view and right-side view, respectively, illustrating a third embodiment in which the printed circuit boards are arranged vertically. An upper arm 39a and a lower arm 39b are projectively provided on the sliding plate 13, which is supported so as to be movable left and right as well as up and down, and a printed circuit board 3 is secured on the arms 39a, 39b at right angles thereto. A drill head 8 is arranged on the front side of the printed circuit board 3 so as to be movable in the direction of the drill shaft and is adapted to direct the drill shaft back and forth. A stand 9 is provided at a position opposing the drill head 8 on the rear side of the printed circuit board 3 and has a sliding contact surface on its distal end for coming into sliding contact with the rear surface of the printed circuit board 3. Operation is the same as that of the first embodiment except that the directions in which the printed circuit board 3 and drill head 8 move differ and the air bearings are not used.

The printed circuit board drilling machine of the invention as described above has the following unique advantages: (1) A large-sized, heavy table used in the prior art for supporting printed circuit boards is unnecessary. (2) The overall apparatus can be reduced in size. (3) The rating of the drive mechanism can be reduced. (4) The printed circuit boards can be moved and positioned at high speed to shorten machining time. (5) Applying ultrasonic vibration to the printed circuit boards reduces the occurrence of epoxy smearing and improves the surface smoothness of the drilled holes.

As many apparently widely different embodiments of the present invention can be made without departing from the spirit and scope thereof, it is to be understood that the invention is not limited to the specific embodiments thereof except as defined in the appended claims.

What is claimed is:

1. A machine for drilling holes in a printed circuit board having parallel, oppositely disposed major surfaces, comprising:

a drive mechanism for supporting a printed circuit board at a peripheral portion thereof and for moving and positioning the printed circuit board in a plane defined by a major surface of said printed circuit board;

a drill provided on one side of said plane, said drill having a drill shaft with the axis of rotation of said drill shaft perpendicular to said plane, said drill being supported for reciprocal movement along said axis of said drill shaft; and a stand provided on the other side of said plane opposite said one said at or near a position opposing said drill and having a sliding contact surface in sliding contact with the printed circuit board;

whereby substantially all thrust of said drill acting upon the printed circuit board during a drilling operation performed by said drill is borne by the sliding contact surface of said stand.

2. The machine according to claim 1, wherein the printed circuit board is moved in a horizontal plane.

3. The machine according to claim 1, wherein the printed circuit board is moved in a plane inclined between a horizontal plane and a vertical plane.

4. The machine according to claim 1, wherein the printed circuit board is moved in a vertical plane.

5. The machine according to any one of claims 1 through 3, wherein the sliding contact surface of said stand is provided with an air bearing actuated when the printed circuit board is moved.

6. The machine according to any one of claims 1 through 4, further comprising an ultrasonic vibrator connected to said stand.

* * * * *